(12) United States Patent
Shintani et al.

(10) Patent No.: US 9,780,334 B2
(45) Date of Patent: Oct. 3, 2017

(54) ORGANIC EL DEVICE HAVING A HYGROSCOPIC LAYER

(71) Applicant: PANASONIC CORPORATION, Osaka (JP)

(72) Inventors: Yoichi Shintani, Osaka (JP); Tatsuhiro Tomiyama, Miyagi (JP); Yasutaka Tsutsui, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 15/111,112

(22) PCT Filed: Jul. 9, 2014

(86) PCT No.: PCT/JP2014/003650
§ 371 (c)(1),
(2) Date: Jul. 12, 2016

(87) PCT Pub. No.: WO2015/136580
PCT Pub. Date: Sep. 17, 2015

(65) Prior Publication Data
US 2016/0351853 A1    Dec. 1, 2016

(30) Foreign Application Priority Data
Mar. 12, 2014    (JP) ................. 2014-049384

(51) Int. Cl.
*H01L 51/52*    (2006.01)
*H01L 51/50*    (2006.01)
*H01L 51/56*    (2006.01)

(52) U.S. Cl.
CPC ...... *H01L 51/5259* (2013.01); *H01L 51/5012* (2013.01); *H01L 51/5234* (2013.01); *H01L 51/5253* (2013.01); *H01L 51/56* (2013.01)

(58) Field of Classification Search
CPC ............ H01L 51/5259; H01L 51/5012; H01L 51/5234; H01L 51/5253; H01L 51/56
See application file for complete search history.

(56) References Cited

U.S. PATENT DOCUMENTS 5,443,922 A    8/1995 Nishizaki et al.
5,578,141 A *  11/1996 Mori ................ B32B 17/10788
                                                136/251

(Continued)

FOREIGN PATENT DOCUMENTS

JP    H05-163488 A    6/1993
JP    2001-068266 A   3/2001

(Continued)

OTHER PUBLICATIONS

International Search Report issued in Application No. PCT/JP2014/003650 dated Oct. 21, 2014, with English translation.

*Primary Examiner* — Ida M Soward
(74) *Attorney, Agent, or Firm* — McDermott Will & Emery LLP

(57) ABSTRACT

An organic EL device includes: an organic EL layer; and a hygroscopic layer that is disposed above and/or below the organic EL layer, and has a hygroscopic film, a first covering film, and a second covering film, the first covering film covering one of main surfaces of the hygroscopic film, the second covering film covering the other main surface of the hygroscopic film, wherein a relational expression A/B≥0.2 is satisfied, where A denotes hygroscopicity indicating mass of moisture, expressed in $g/m^2$, that is absorbable by the hygroscopic film per unit of area, and B denotes the number of defects per unit of area, expressed in $pieces/mm^2$, that is calculated based on the number of defects in each of the first covering film and the second covering film.

6 Claims, 8 Drawing Sheets

(56) References Cited

U.S. PATENT DOCUMENTS

| | | | |
|---|---|---|---|
| 6,465,953 B1 | 10/2002 | Duggal | |
| 6,692,326 B2* | 2/2004 | Choi | H01L 51/5259 427/66 |
| 6,924,594 B2* | 8/2005 | Ogura | H05B 33/04 313/506 |
| 7,465,963 B2* | 12/2008 | Hayashi | H01L 51/5206 257/103 |
| 7,572,478 B2* | 8/2009 | Ogura | H05B 33/04 313/504 |
| 9,203,042 B2* | 12/2015 | Schmid | H01L 51/107 |
| 2003/0003225 A1 | 1/2003 | Choi et al. | |
| 2005/0012248 A1 | 1/2005 | Yi et al. | |
| 2008/0032067 A1* | 2/2008 | Sakurazawa | C08J 5/18 428/1.5 |
| 2009/0001360 A1 | 1/2009 | Nakayama | |
| 2009/0023232 A1* | 1/2009 | Taniguchi | H01L 51/5253 438/20 |
| 2009/0244703 A1* | 10/2009 | Asakura | B29C 41/28 359/485.01 |
| 2013/0248827 A1* | 9/2013 | Togano | H01L 51/5012 257/40 |
| 2014/0027739 A1* | 1/2014 | van de Weijer | H01L 51/5256 257/40 |
| 2014/0049825 A1* | 2/2014 | van Mol | H01L 51/5253 359/513 |
| 2014/0151671 A1* | 6/2014 | Saitou | H01L 51/5246 257/40 |
| 2015/0167249 A1* | 6/2015 | Ono | B32B 29/02 162/130 |
| 2015/0338563 A1* | 11/2015 | Kiuchi | C07D 403/00 106/170.1 |
| 2016/0025900 A1* | 1/2016 | Suzuki | B32B 23/20 257/40 |
| 2016/0284271 A1* | 9/2016 | Yamazaki | G09G 3/2018 |

FOREIGN PATENT DOCUMENTS

| | | |
|---|---|---|
| JP | 2002-056970 A | 2/2002 |
| JP | 2003-007454 A | 1/2003 |
| JP | 2005-510757 A | 4/2005 |
| JP | 2006-059620 A | 3/2006 |
| JP | 2006-272190 A | 10/2006 |
| JP | 2009-031761 A | 2/2009 |
| JP | 2011-246292 A | 12/2011 |
| JP | 2012-533152 A | 12/2012 |
| JP | 2013-049602 A | 3/2013 |
| JP | 2013-544012 A | 12/2013 |
| JP | 2014-500582 A | 1/2014 |
| WO | 2003/046649 A1 | 6/2003 |
| WO | 2011/005095 A1 | 1/2011 |
| WO | 2012/057615 A2 | 5/2012 |
| WO | 2012/057618 A1 | 5/2012 |

* cited by examiner

FIG. 4

| | Thickness t (μm) | Hygroscopic capacity C (g/(m²·μm)) | Hygroscopicity A (g/m²) | The number of defects B (pieces/mm²) | | | A/B | | | Estimated operating life value (h) | | | Experimental operating life value (h) |
|---|---|---|---|---|---|---|---|---|---|---|---|---|---|
| | | | | Barrier 1 | Barrier 2 | | Barrier 1 | Barrier 2 | Average | Barrier 1 | Barrier 2 | Average | |
| 1 | 2 | 0.1 | 0.2 | 1 | 1 | | 0.20 | 0.20 | 0.20 | 1000.0 | 1000.0 | 1000.0 | 1000 |
| 2 | 2 | 0.1 | 0.2 | 1.5 | 2.7 | | 0.13 | 0.07 | 0.10 | 666.7 | 370.4 | 518.5 | 500 |
| 3 | 5.5 | 0.1 | 0.55 | 15 | 24 | | 0.04 | 0.02 | 0.03 | 183.3 | 114.6 | 149.0 | 120 |
| 4 | 2 | 0.1 | 0.2 | 27 | 15 | | 0.01 | 0.01 | 0.01 | 37.0 | 66.7 | 51.9 | 50 |
| 5 | 2 | 0.08 | 0.16 | 0.5 | 0.7 | | 0.32 | 0.23 | 0.27 | 1600.0 | 1142.9 | 1371.4 | 1200 |

US 9,780,334 B2

ORGANIC EL DEVICE HAVING A HYGROSCOPIC LAYER

RELATED APPLICATIONS

This application is the U.S. National Phase under 35 U.S.C. §371 of International Application No. PCT/JP2014/003650, filed on Jul. 9, 2014, which in turn claims the benefit of Japanese Application No. 2014-049384, filed on Mar. 12, 2014, the disclosures of which are incorporated by reference herein.

TECHNICAL FIELD

The present disclosure relates to an organic EL device including an organic EL layer and a hygroscopic layer.

BACKGROUND ART

There has been used an organic EL device that for example includes, above a glass substrate, a display unit having an organic EL layer between an anode and a cathode.

In recent years, there has been a demand for an organic EL display device that is excellent in terms of design and mobility. An organic EL display device having an excellent design for example includes a display unit that is curved. An organic EL display device having an excellent mobility for example has a further reduced weight.

In response to the above demand, a technology has been proposed that uses a resin substrate (a resin film) having flexibility for an organic EL display device instead of a glass substrate (for example, Patent Literature 1). However, the resin substrate exhibits a low barrier property against moisture. For this reason, moisture intrusion into an organic EL layer through the resin substrate might change luminescent color, or even worse, might disable light emission.

In view of this, a technology has been proposed that prevents moisture intrusion into a display unit (organic EL layer) by providing a hygroscopic layer between a resin substrate and the display unit to absorb moisture (for example, Patent Literature 2).

The hygroscopic layer has a hygroscopic film that is sandwiched between a pair of covering films. The covering films are made of a material whose moisture vapor transmission rate, which indicates a degree of moisture transmission, is low. The hygroscopic layer prevents transmission of moisture through the covering films, and absorbs moisture, which has intruded through the covering films, and thereby to prevent intrusion of the moisture into the display unit. Note that the hygroscopic layer is referred to also as a waterproof layer having a waterproof property because of preventing moisture intrusion into the display unit.

CITATION LIST

Patent Literature

[Patent Literature 1] Japanese Patent Application Publication No. 2009-031761
[Patent Literature 2] Japanese Patent Application Publication No. 2012-533152

SUMMARY OF INVENTION

Technical Problem

However, it was proved that the operating life of the organic EL layer is not increased even by using the covering films having a low moisture vapor transmission rate such as disclosed in the above Patent Literature 2. That is, it was proved that hygroscopic (waterproof) property of the hygroscopic layer is insufficient to increase the operating life of the organic EL layer.

The present disclosure aims to provide an organic EL device that further prevents moisture transmission into an organic EL layer, a design method of the organic EL device, and a manufacturing method of the organic EL device.

Solution to Problem

One aspect of the present disclosure provides an organic EL device comprising: an organic EL layer; and a hygroscopic layer that is disposed above and/or below the organic EL layer, and has a hygroscopic film, a first covering film, and a second covering film, the first covering film covering one of main surfaces of the hygroscopic film, the second covering film covering the other main surface of the hygroscopic film, wherein a relational expression $A/B \geq 0.2$ is satisfied, where A denotes hygroscopicity indicating mass of moisture, expressed in $g/m^2$, that is absorbable by the hygroscopic film per unit of area, and B denotes the number of defects per unit of area, expressed in $pieces/mm^2$, that is calculated based on the number of defects in each of the first covering film and the second covering film.

Advantageous Effects of Invention

The organic EL device relating to the above aspect includes the hygroscopic film having hygroscopic property in consideration of the defects in the covering films. With this structure, it is possible to prevent moisture transmission into the organic EL layer.

BRIEF DESCRIPTION OF DRAWINGS

FIG. 4 shows specifications of hygroscopic layers used in an operating life test and results of the operating life test.

DESCRIPTION OF EMBODIMENTS

Figure 1:
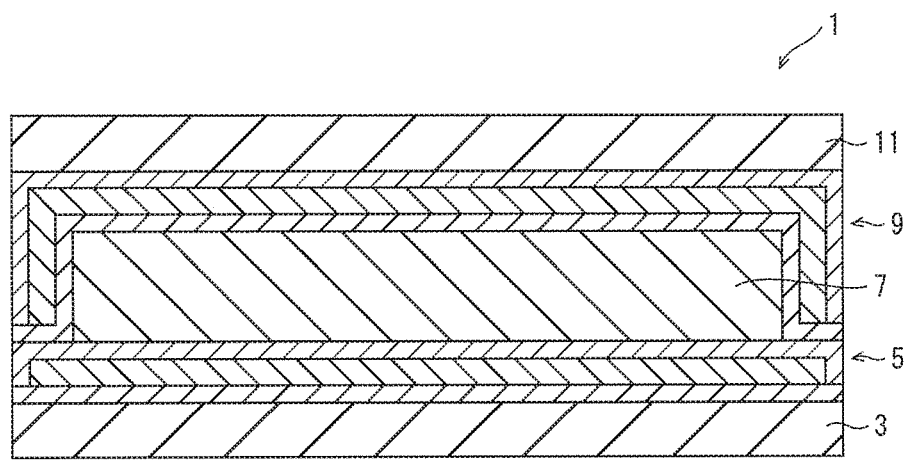
FIG. 1 is a cross-sectional view schematically showing the structure of an organic EL device relating to a first embodiment.

One aspect of the present disclosure provides an organic EL device comprising: an organic EL layer; and a hygroscopic layer that is disposed above and/or below the organic EL layer, and has a hygroscopic film, a first covering film, and a second covering film, the first covering film covering one of main surfaces of the hygroscopic film, the second covering film covering the other main surface of the hygroscopic film, wherein a relational expression A/B≥0.2 is satisfied, where A denotes hygroscopicity indicating mass of moisture, expressed in $g/m^2$, that is absorbable by the hygroscopic film per unit of area, and B denotes the number of defects per unit of area, expressed in $pieces/mm^2$, that is calculated based on the number of defects in each of the first covering film and the second covering film.

Also, an expression B≤1 may be satisfied.

With this structure, it is possible to improve a waterproof function of the covering films.

Also, the first covering film and the second covering film may each be an inorganic film.

With this structure, it is possible to increase a waterproof property of the hygroscopic layer.

Also, the moisture absorbent may be zeolite.

With this structure, it is possible to improve a hygroscopic property of the hygroscopic film.

Another aspect of the present disclosure provides a design method of an organic EL device that includes: an organic EL layer; and a hygroscopic layer that is disposed above and/or below the organic EL layer, and has a hygroscopic film, a first covering film, and a second covering film, the first covering film covering one of main surfaces of the hygroscopic film, the second covering film covering the other main surface of the hygroscopic film, the design method comprising the steps of: calculating, as a reference, a relational expression between hygroscopicity A and the number B of defects that satisfies a desired operating life of the organic EL layer, where the hygroscopicity A indicates mass of moisture, expressed in $g/m^2$, that is absorbable by the hygroscopic film per unit of area, and the number B of defects indicates the number of defects per unit of area, expressed in $pieces/mm^2$, that is calculated based on the number of defects in each of the first covering film and the second covering film; counting the number b of defects based on the number of defects in each of the first covering film and the second covering film to be used; and calculating hygroscopicity a of the hygroscopic film to be used by substituting the counted number b of defects into the relational expression for the number B of defects.

With this structure, it is possible to design an organic EL device including a hygroscopic layer with a waterproof function and a hygroscopic function that fulfill the above purpose.

Also, a relational expression A/B≥0.2 may be satisfied.

With this structure, it is possible to design an organic EL device having a desired operating life.

Further another aspect of the present disclosure provides a manufacturing method of an organic EL device that includes: an organic EL layer; and a hygroscopic layer that is disposed above and/or below the organic EL layer, and has a hygroscopic film, a first covering film, and a second covering film, the first covering film covering one of main surfaces of the hygroscopic film, the second covering film covering the other main surface of the hygroscopic film, the manufacturing method comprising the step of manufacturing the hygroscopic film having hygroscopicity equal to or higher than the hygroscopicity a calculated by the above design method.

With the above structure, it is possible to manufacture an organic EL device having a high waterproof property.

First Embodiment

In a first embodiment, description is given on the outline of a device including a functional layer whose function deteriorates due to moisture absorption.

Description is given here on an organic EL device including an organic EL layer as the functional layer.

1. Overall Structure

FIG. 1 is a cross-sectional view schematically showing the structure of an organic EL device relating to the first embodiment.

An organic EL device 1 includes a display unit 7. The display unit 7 has an organic EL layer that is interposed between an anode and a cathode.

The organic EL device 1 includes a hygroscopic layer on the side of at least one of main surfaces of the display unit 7 (the hygroscopic layer disposed above and/or below the display unit 7). In the present embodiment, the organic EL device 1 includes hygroscopic layers 5 and 9 on the respective main surfaces of the display unit 7 (the hygroscopic layer 5 is disposed below the display unit 7 and the hygroscopic layer 9 is disposed above the display unit 7). In other words, the display unit 7 is sandwiched between the hygroscopic layers 5 and 9.

The specific description is given below.

As shown in FIG. 1, the organic EL device 1 includes a base 3 and the hygroscopic layer 5, the display unit 7, and the hygroscopic layer 9 that are disposed on the base 3 in respective order. Here, the organic EL device 1 includes a surface covering layer 11 on the side of the hygroscopic layer 9 opposite the display unit 7. Note that the organic EL device 1 has a front face on the side of the surface covering layer 11 and a back face on the side of the base 3.

(1) Base

The base 3 has a function of supporting the display unit 7 and so on. In other words, the hygroscopic layer 5, the display unit 7, the hygroscopic layer 9, and the surface covering layer 11 are disposed (layered) on an upper surface of the base 3.

The base 3 is made of a resin material, a ceramic material, a metal material, or the like. The organic EL device 1 relating to the present embodiment has flexibility, and accordingly the base 3 is preferably made of a flexible resin material.

In consideration of an influence of moisture on the organic EL layer, the base 3 should preferably be made of a material having a low transmission rate of moisture (hereinafter, referred to as a moisture vapor transmission rate). However, a resin film that is made of a resin material is preferably used as the base 3 such that the base 3 has flexibility.

(2) Hygroscopic Layers

The hygroscopic layers 5 and 9 each have a waterproof function of preventing moisture intrusion into the display unit 7 from the front face and the back face of the organic EL device 1. The details of the hygroscopic layers 5 and 9 are described later.

(3) Display Unit

The display unit 7 has luminescent performance that deteriorates due to moisture intrusion into the organic EL layer and moisture absorption by the organic EL layer. Specifically, the luminescent performance deteriorates due to change of properties of an organic material of the organic EL layer.

(4) Surface Covering Layer

The surface covering layer 11 covers the display unit 7. To be exact, the surface covering layer 11 is formed as a layer on an upper surface of the hygroscopic layer 9 to indirectly cover the display unit 7.

The surface covering layer 11 has a protection function of, when the organic EL device 1 is subject to a mechanical shock, preventing the display unit 7 from undergoing a direct damage. The surface covering layer 11 has a function of preventing gas such as moisture and oxygen from intruding into the display unit 7 though not completely.

The surface covering layer 11 is for example a resin film made of a resin material, a nitride film such as a silicon nitride film, an oxide film such as a silicon oxide film, a metal film, or the like. The organic EL device 1 has flexibility as described above. For this reason, the surface covering layer 11 is made of a flexible resin material.

In consideration of the influence of moisture on the organic EL layer, the surface covering layer 11 should preferably be made of a material having a low moisture vapor transmission rate. However, the surface covering layer 11 is preferably made of a resin material so as to have flexibility.

2. Hygroscopic Layers

Figure 2:
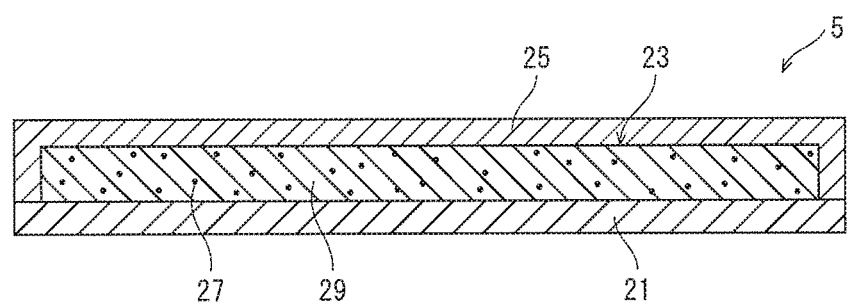
FIG. 2 is a cross-sectional view schematically showing the structure of a hygroscopic layer shown in FIG. 1.

FIG. 2 shows a cross-section of the hygroscopic layer 5.

(1) Overall Structure

The hygroscopic layers 5 and 9 may have the same structure or different structures. In the present embodiment, the hygroscopic layers 5 and 9 have the same structure. As shown in FIG. 2, the hygroscopic layers 5 and 9 each have a first covering film 21, a hygroscopic film 23, and a second covering film 25. The first covering film 21, the hygroscopic film 23, and the second covering film 25 are layered so as to adhere to each other. In other words, the main surfaces (a back face and a front face) of the hygroscopic film 23 are covered with a pair of the first covering film 21 and the second covering film 25, respectively.

The first covering film 21 is disposed on the side near an external air (the side of the base 3 or the surface covering layer 11). The second covering film 25 is disposed on the side near the display unit 7. In other words, the first covering film 21 which is included in hygroscopic layer 5 is disposed on the side near the base 3, the first covering film 21 which is included in the hygroscopic layer 9 is disposed on the side near the surface covering layer 11.

The first covering film 21 prevents moisture intrusion from the side of the external air into a corresponding one of the hygroscopic layers 5 and 9. The hygroscopic film 23 absorbs moisture that has transmitted through the first covering film 21. The second covering film 25 prevents intrusion of the moisture, which has transmitted through the first covering film 21 and has been absorbed by the hygroscopic film 23, into the display unit 7. With this structure, the hygroscopic layers 5 and 9 prevent moisture intrusion from the side of the external air into the display unit 7.

(2) Covering Films

The first covering film 21 and the second covering film 25 may have the same structure or different structures. In the present embodiment, the first covering film 21 and the second covering film 25 have the same structure. For this reason, the first covering film 21 and the second covering film 25 are hereinafter collectively referred to as the first and second covering film 21, 25 when it is not necessary to distinguish therebetween irrespective of arrangement or the like of them.

The first and second covering film 21, 25 is made of a material having a low moisture vapor transmission rate. Specifically, the first and second covering film 21, 25 is made of a material having a lower moisture vapor transmission rate than the materials of the base 3 and the surface covering layer 11. More specifically, the first and second covering film 21, 25 has a moisture vapor transmission rate of approximate $1 \times 10^{-4}$ $g/m^2/d$ to $1 \times 10^{-6}$ $g/m^2/d$ at 40 degrees C. and 90% relative humidity (RH) atmosphere.

Note that the first and second covering film 21, 25 should preferably have a moisture vapor transmission rate that is as low as possible.

The material having a low moisture vapor transmission rate is for example an inorganic film. Examples of the inorganic film include a nitride film such as a silicon nitride film, an oxide film such as a silicon oxide film, an oxynitride film such as a silicon oxynitride film, and a metal oxide film such as an indium tin oxide (ITO) film and a silver oxide film. The inorganic film is made for example by using a vacuum deposition method such as a CVD method and a sputtering method.

However, the first and second covering film 21, 25, which is an inorganic film, includes minute defects 31 (see FIG. 3) that are inevitable in manufacturing. Also, it is difficult to manage parts where the defects 31 are likely to occur in the manufacturing process, and accordingly it is difficult to partially provide hygroscopic films corresponding in position to the defects 31.

Here, the defects 31 indicate defects through which moisture transmits. The defects 31 are for example pin holes or the like that have locally occurred in an inorganic film that is formed by using the vacuum deposition method.

(3) Hygroscopic Film

The hygroscopic film 23 mainly absorbs moisture that has intruded through the defects 31 in the first covering film 21 into a corresponding one of the hygroscopic layers 5 and 9. This prevents reaching of moisture, which has intruded through the defects 31 in the first covering film 21, to the display unit 7.

The hygroscopic film 23 is basically made of a hygroscopic material. The hygroscopic film 23 may be made for example of a resin material having a high hygroscopic property, a porous material, or a fiber material. The hygroscopic film 23 should preferably have a hygroscopic property of 5 mass % or higher.

Further, the hygroscopic film 23 may be made of a material containing a moisture absorbent. As shown in FIG. 2, the hygroscopic film 23 here is made of a moisture absorbent 27 that is mixed into a base material 29.

The moisture absorbent 27 is a chemical desiccant, a physical desiccant, or the like. The chemical desiccant takes advantage of the property inherent to chemical substances (chemical reaction, deliquescence, and so on), and examples thereof include calcium oxide (CaO), calcium chloride (CaCl), barium peroxide (BaO), sodium hydroxide (NaOH), and so on. The physical desiccant takes advantage of the property that water molecules tend to adhere to a porous surface, and examples thereof include silica gel, aluminum oxide, molecular sieve, allophane, zeolite, and so on.

The base material 29 is a ceramic material, an organic material, or the like. Examples of the ceramic material include yttrium aluminum garnet (YAG) ceramic, alumina (aluminum oxide) ceramic, and so on.

Examples of the organic material include acrylic resin, polycarbonate resin, polyethylene terephthalate resin, polyvinyl chloride resin, polystyrene resin, epoxy resin, silicone resin, and so on.

The material of the base material 29 is appropriately selected depending on the intended use of the display unit 7. For example, in the case where the display unit 7 (and the hygroscopic layers 5 and 9) need to have flexibility, a resin material is preferably selected. In the case where the hygroscopic layer 5 needs to have translucency, a translucent material is selected. In the case where manufacturing at a low cost is required, an organic material is selected.

3. Performance

As a result of various considerations, the inventors concluded that since the defects 31 exist in the first and second covering film 21, 25 of each of the hygroscopic layers 5 and 9, it is impossible to completely prevent moisture transmission through the first and second covering film 21, 25 even by using a material having a low moisture vapor transmission rate for the first and second covering film 21, 25.

Then, the inventors further made earnest considerations and found that the influence on the display unit 7 is estimated from the relationship between the hygroscopicity of the hygroscopic film 23 and the number of defects that is calculated based on the number of defects in each of the first and second covering film 21, 25. The inventors especially believed that the moisture vapor transmission rate of the covering films has a great relationship with the defects therein, but initially could found no relationship between the hygroscopicity and the number of defects per unit area of 1 $m^2$. However, the inventors made local observation (unit of area: 1 $m^2$) to detect a region where a lot of defects locally exist, and then found the relationship between the number of defects and the influence on the display unit 7 from the number of defects in the local region.

Note that the influence on the display unit 7 was specifically assessed based on the length of the operating life of the display unit 7 (by an accelerated deterioration test). The operating life represents waterproof property in practical use of the hygroscopic layers 5 and 9.

(1) Hygroscopic Capacity and Hygroscopicity

Hygroscopic capacity is a capacity inherent to the material of the hygroscopic film 23, and is defined by mass of moisture (unit: g) that is absorbable by the hygroscopic film 23 per unit of thickness (unit: 1 μm) and unit of area (unit: 1 $m^2$). The hygroscopic capacity is expressed in $g/(m^2 \cdot \mu m)$. In the case for example where the hygroscopic film 23, which has thickness of 5 μm and area (projected area) of 3 $m^2$, absorbs moisture of 15 g, the hygroscopic film 23 has hygroscopic capacity of 1 $g/(m^2 \cdot \mu m)$. Note that the hygroscopic capacity here is defined (adjusted) mainly by a content ratio of the moisture absorbent 27 to the base material 29.

Also, hygroscopicity indicates the product of the hygroscopic capacity and the thickness of the hygroscopic film 23, that is, the mass of moisture (unit: g) that is absorbable by the hygroscopic film 23 per unit of area (unit: 1 $m^2$). The hygroscopicity is expressed in $g/m^2$. In the case for example where the hygroscopic film 23, which has the thickness of 5 μm and the hygroscopic capacity of 1 $g/(m^2 \cdot \mu m)$ such as above, the hygroscopic film 23 has hygroscopicity of 5 $g/m^2$.

Note that the hygroscopic capacity and the hygroscopicity of the hygroscopic film 23 are calculated by measuring variation in mass of the hygroscopic film 23 that has been dried once and then caused to absorb moisture. Alternatively, in the case where hygroscopic capacity of the moisture absorbent 27 is known, the hygroscopic capacity and the hygroscopicity of the hygroscopic film 23 may be estimated from a contained amount of the moisture absorbent 27.

(2) The Number of Defects

Figure 3:
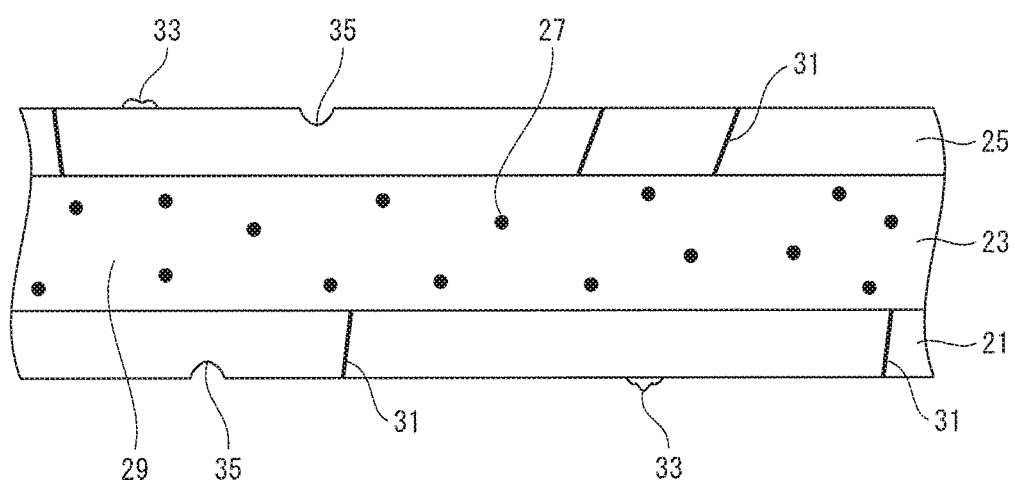
FIG. 3 is a cross-sectional view schematically showing the structure of a hygroscopic layer in which defects exist.

FIG. 3 schematically shows the hygroscopic layer 5 in which the defects 31 exist.

As shown in the figure, the first and second covering film 21, 25 has the defects 31 that have occurred in the manufacturing process. The defects 31 here indicate defects through which moisture transmits through the first and second covering film 21, 25, as described above. That is, the defects 31 cause moisture intrusion into the display unit 7.

Accordingly, foreign substances 33, concaves 35, and so on that exist in the first and second covering film 21, 25 are not regarded as the defects 31 unless moisture intrudes through the foreign substances 33, the concaves 35, and so on.

The number of defects is defined by the number of the defects 31 per unit of area (unit: 1 $mm^2$), and is expressed in pieces/$mm^2$.

(3) Operating Life (3-1) Experiment Results

The inventors performed an operating life test on an organic EL device (a display unit) including a hygroscopic layer. The operating life test is an accelerated deterioration test at high temperature and high humidity atmosphere. The end of the operating life of the display unit was assessed when dark spots appeared in the display unit.

FIG. 4 shows specifications of samples used in the operating life test and results of the operating life test.

In the operating life test, five type of samples were used which have different specifications of the hygroscopic layer and the same specifications of the display unit.

The following explains the terms in the figure. Thickness t indicates thickness of a hygroscopic film, and is expressed in μm. Hygroscopic capacity C indicates mass of moisture that is absorbable by the hygroscopic film per unit of thickness and unit of area, and is expressed in $g/(m^2 \cdot \mu m)$, as described above. Hygroscopicity A indicates mass of moisture that is absorbable by the hygroscopic film per unit of area, and is expressed in $g/m^2$. The hygroscopicity A is equal to the product of the thickness t and the hygroscopic capacity C.

The number B of defects indicates the number of defects per unit of area that is calculated based on the number of defects in each of the first covering film and the second covering film, and is expressed in pieces/$mm^2$. Note that the first covering film and the second covering film correspond to barriers 1 and 2 in the figure, respectively.

Experimental value operating life l (lower-case letter L) indicates a time period before dark spots appear in the display unit, and is expressed in h. Estimated operating life value L was calculated with reference to the result of Sample 1. This calculation was made taking advantage of a proportional relationship between ratio A/B and the estimated operating life value L (see FIG. 5).

For example, the barrier 1 in Sample 2 has ratio A/B of 0.13. This value is 0.667 times 0.20, which is the ratio A/B of the barriers of Sample 1. In Sample 1, ratio A/B of the barrier is 0.2 (the values in the barriers 1 and 2 and the average value are equal), and experimental operating life value l is 1000 h. Accordingly, in Sample 2, estimated operating life value L of the barrier 1 is 666.7 h, which is the product of the experimental operating life value l in Sample 1 and 0.667 h, which is ratio of the ratio A/B in Sample 2 to the ratio A/B in Sample 1.

In FIG. 4, regarding a column A/B, ratio A/B is calculated with respect to the numbers B of defects in each of the barriers 1 and 2 shown in a column the number of defects B, and average indicates the average value of the ratios A/B of the barriers 1 and 2.

Similarly, regarding a column estimated operating life value L, estimated operating life value L is calculated with respect to each of the ratios A/B of the barriers 1 and 2 shown in the column A/B, and average indicates the average value of the estimated operating life values L of the barrier 1 and 2.

The hygroscopic layer used for the samples includes the first and second covering film 21, 25 made of silicon nitride.

The hygroscopic film 23 includes the moisture absorbent 27 made of zeolite and the base material 29 made of acrylic resin.

As shown in FIG. 4, the accelerated deterioration test was performed on Samples 1-5 each having different thickness t and the different number B of defects. Note that Sample 1, which is the reference, has the ratio A/B of 0.2 and the experimental operating life value l of 1000 h with respect to both the barriers 1 and 2.

Regarding the samples other than Sample 1, it is found as shown in FIG. 4 that the estimated operating life value L, which is calculated from the ratio A/B and the experimental operating life value l of Sample 1, is substantially equal to the experimental operating life value l which is the actual experimental value.

Figure 5:
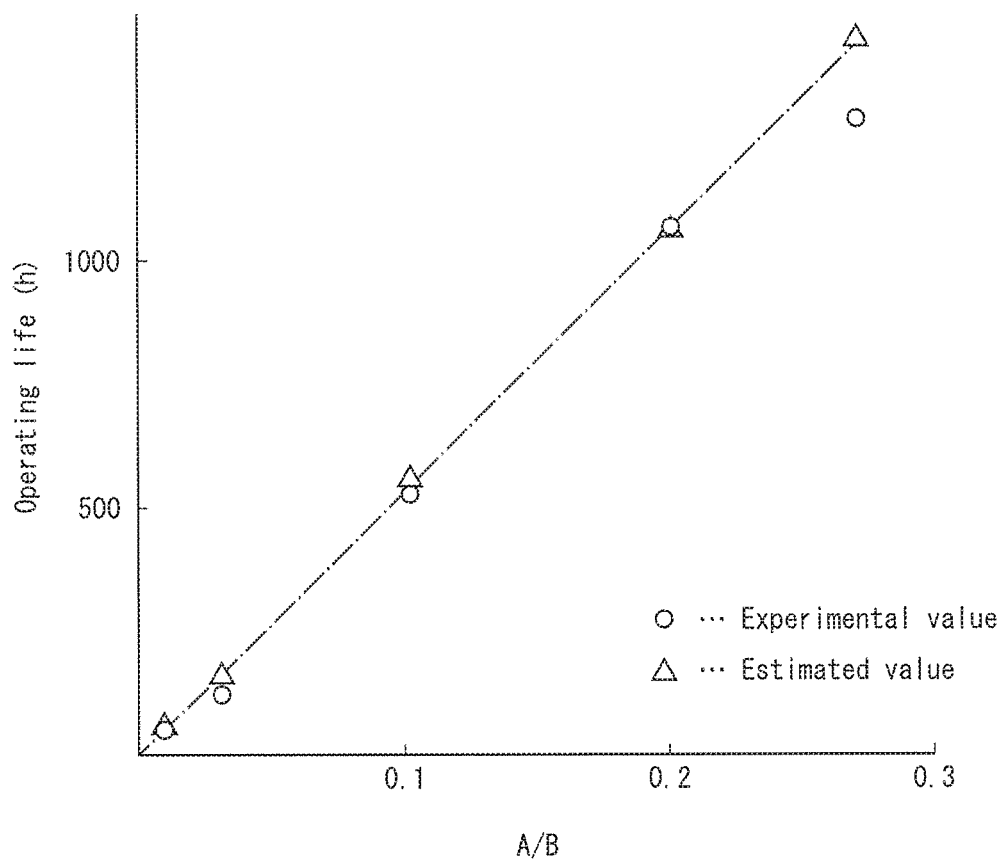
FIG. 5 shows relationship between a ratio A/B and an estimated operating life value L.

FIG. 5 shows the relationship between the ratio A/B and the estimated operating life value L.

As shown in FIG. 5, it is found that the estimated operating life value L is in substantially a proportional relationship with the ratio A/B. It is also found that the estimated operating life value L is substantially equal to the experimental operating life value l.

(3-2) Relational Expression Between A and B

The estimated operating life value L and the experimental operating life value l are in substantially a proportional relationship with the ratio A/B, as described above.

The following describes the relationship between the hygroscopicity A and the number B of defects.

First, ratio $A_R/B_R$ and operating life value $l_R$ corresponding to the ratio $A_R/B_R$ are determined as a reference. When the ratio A/B is a variable for example, the estimated operating life value L is calculated by the following Expression (1).

$$L=(l_R/(A_R/B_R))\times(A/B) \quad (1)$$

The above ratio $A_R/B_R$ and the operating life value $l_R$ as the reference are obtained by preparing at least one sample and performing an experiment. Here, ratio $l_R/(A_R/B_R)$ as the reference is the slope of a straight line in the relationship between the estimated operating life value L and the ratio A/B.

Expression (1) is modified to the following Expression (2).

$$A/B=((A_R/B_R)/l_R)\times L \quad (2)$$

Here, a target operating life value of organic EL device (the display unit) as a real device is substituted into Equation (2) for the estimated operating life value L in the accelerated deterioration test. As a result, the relationship between the hygroscopicity A and the number B of defects is obtained.

The number B of defects indicates the number of defects that have occurred in the manufacturing process, and is countable in advance by experiments and so on. Specifically, when the number b of defects in the covering film is counted by experiments and so on, hygroscopicity a of the hygroscopic film 23 corresponding to the number b of defects is calculated by Equation (3) which is based on Equation (2).

$$a=b\times((A_R/B)/l_R)\times L \quad (3)$$

Also, the hygroscopicity A is calculated from the hygroscopic capacity C and the thickness t by Equation (4).

$$A=C\times t \quad (4)$$

Accordingly, the thickness t is calculated from the hygroscopicity a, which is a specific value, by Equation (5).

$$t=a/C \quad (5)$$

In this way, the ratio $A_R/B_R$ and the operating life value $l_R$ are determined by the experiments and so on, and the target operating life value, which is necessary for the organic EL device, is substituted for the estimated operating life value L in the accelerated deterioration test. As a result, specification of a hygroscopic layer to be used is determined.

(3-3) Specific Examples

The following specifically describes the above relational expressions.

The description is given here with use of the experiment result of Sample 2 as a reference.

Sample 2, the average value of the ratio $A_R/B_R$ is 0.10, and the experimental operating life value $l_R$ corresponding thereto is 500 h. Here, the estimated operating life value of the organic EL device relating to the present embodiment in the accelerated deterioration test is 1000 h or longer.

The following relational expression is obtained by substituting these values into Equation (2).

$$A/B\geq((0.1)/500)\times1000$$

$$A/B\geq0.2$$

This results in the relational expression between the hygroscopicity A as a variable and the number B of defects as a variable.

Here, the number B of defects that was counted by experiments and so on is basically one or less. When b=1, the hygroscopicity a of the hygroscopic film to be actually used is calculated as follows.

$$a\geq0.2$$

Here, in the case where the hygroscopic capacity C is 0.1 g/(m²·μm), which is equal to those in Samples 1-4, the thickness t is calculated as follows by Equation (5).

$$t\geq0.2/0.1$$

$$t\geq2$$

On the other hand, in the case where the hygroscopic capacity C is set to 0.2 g/(m²·μm), which is higher than those in Samples 1-4, the thickness t is calculated as follows by Equation (5).

$$t\geq0.2/0.2$$

$$t\geq1$$

4. Design Method

As described above, by determining the hygroscopicity $A_R$, the number $B_R$ of defects, and the experimental operating life value $l_R$ as the reference, it is possible to design the hygroscopic layer that satisfies the target operating life value of the organic EL device.

The following describes the design method in detail.

The hygroscopic layer is designed in the following procedures (i), (ii), and (iii).

(i) Calculate the relational expression between the hygroscopicity A and the number B of defects, where the hygroscopicity A indicates mass of moisture, expressed in g/m², that is absorbable by the hygroscopic film per unit of area, and the number B of defects indicates the number of defects per unit of area, expressed in pieces/mm², that is calculated based on the number of defects in each of the first covering film and the second covering film.

Specifically, determine the hygroscopicity $A_R$, the number $B_R$ of defects, and the experimental operating life value $l_R$ of the organic EL device, and calculate the relational expression between A and B from the hygroscopicity $A_R$, the number $B_R$ of defects, and the target operating life value of the organic EL device by for example Equation (2).

Here, the defects exist in each of the barrier 1 (the first covering film) and the barrier 2 (the second covering film). The number B of defects as the reference may be the number of defects in the barrier 1, the number of defects in the barrier 2, or the average value of the numbers of defects in the barriers 1 and 2. Alternatively, the number B of defects as the reference may be a larger one of the numbers of defects in the barriers 1 and 2. As a matter of course, in the case where the larger number of defects is adopted, the hygroscopic layer is designed such that the hygroscopic film has a larger thickness and the display unit (the EL organic device) has a longer operating life than the case where the smaller number of defects is adopted and the case where the average value is adopted.

Also, even in the case where the first covering film and the second covering film have different thicknesses, the number B of defects as the reference may be the number of defects in the barrier 1, the number of defects in the barrier 2, or the average value of the numbers of defects in the barriers 1 and 2. Alternatively, the number B of defects may be a larger one of the numbers of defects in the barriers 1 and 2.

Further, the number B of defects, which indicates the number of defects that exist in an area of 1 mm$^2$, may be the average value of the respective numbers of defects that exist in a plurality of parts or the maximum value among the respective numbers of defects that exist in the parts. In the case where the maximum value is adopted, the hygroscopic layer is designed such that the display unit (the EL organic device) has a longer operating life than the case where the average value is adopted.

(ii) Count the number b of defects based on the number of defects in each of the first covering film and the second covering film to be used.

Specifically, determine the number B of defects by experiments and so on. Here, the number b of defects is counted in consideration of manufacturing irregularities and so on. For example, the number b of defects may be statistically counted based on the number of defects in prototypes.

(iii) Substitute the counted number b of defects into the relational expression between A and B for the number B of defects to calculate hygroscopicity a of the hygroscopic film to be used.

Specifically, calculate the hygroscopicity A by Equation (3).

By applying this design method to the manufacturing method of the organic EL device, it is possible to manufacture an organic EL device including a hygroscopic layer that satisfies the target operating life value.

The organic EL device is manufactured for example by the following manufacturing method. Specifically, the manufacturing method is a manufacturing method of an organic EL device that includes: an organic EL layer; and a hygroscopic layer that is disposed above and/or below the organic EL layer, and has a hygroscopic film, a first covering film, and a second covering film, the first covering film covering one of main surfaces of the hygroscopic film, the second covering film covering the other main surface of the hygroscopic film. The manufacturing method includes the step of manufacturing the hygroscopic film having hygroscopicity equal to or higher than the hygroscopicity a calculated by the above design method.

Second Embodiment

In a second embodiment, description is given on an organic EL display device.

1. Outline of Structure

Figure 6:
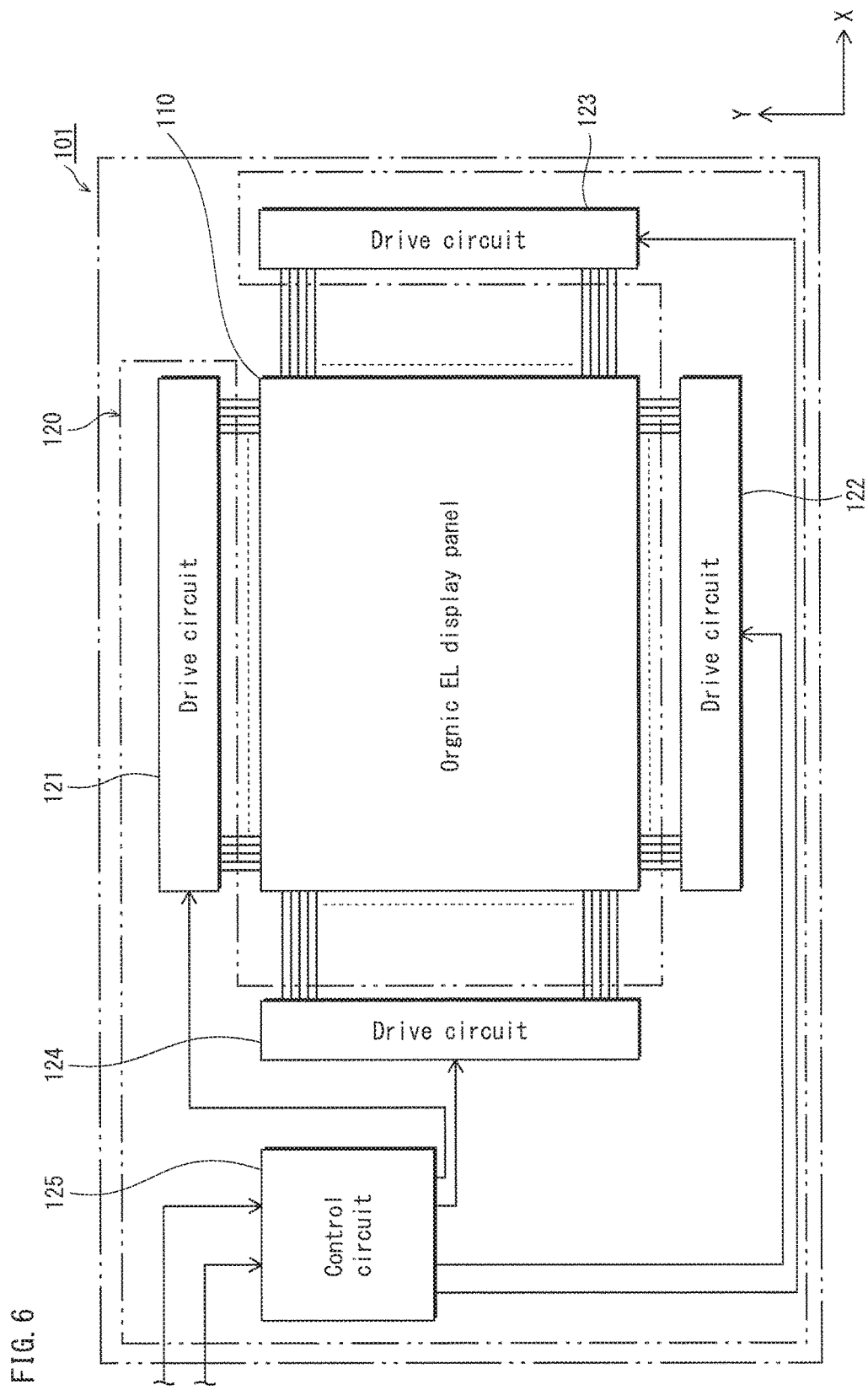
FIG. 6 is a block diagram schematically showing the structure of an organic EL display device relating to a second embodiment.
Figure 7:
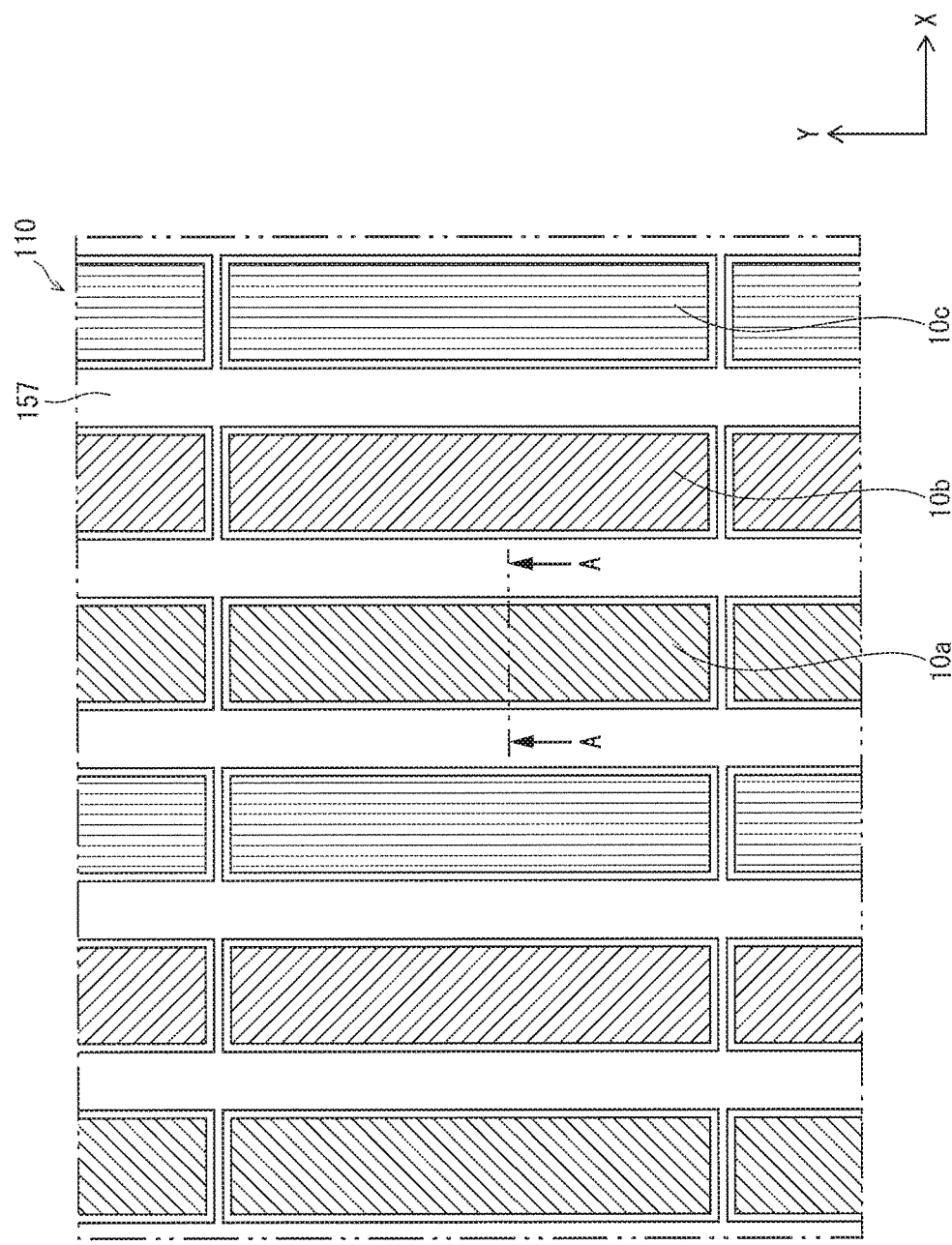
FIG. 7 is a plan view schematically showing arrangement of subpixels in the organic EL display panel shown in FIG. 6.

The following describes the outline of the structure of an organic EL display device 101 relating to the second embodiment with reference to FIG. 6 and FIG. 7.

FIG. 6 is a schematic block diagram showing the outline of the structure of the organic EL display device 101 relating to the second embodiment. FIG. 7 is a schematic plan view showing arrangement of subpixels 10a-10c in an organic EL display panel 110.

As shown in FIG. 6, the organic EL display device 101 includes the organic EL display panel 110 and a drive and control unit 120 that is connected to the organic EL display panel 110. The organic EL display panel 110 is an organic EL display panel that employs electroluminescence phenomenon of organic materials. The organic EL display panel 110 here has a curved display surface.

As shown in FIG. 7, the subpixels 10a-10c are two-dimensionally arranged in the X-axis direction and the Y-axis direction. In the second embodiment, the subpixels 10a emit red (R) light, the subpixels 10b emit green (G) light, and the subpixels 10c emit blue (B) light, for example.

Combination of each three adjacent subpixels 10a-10c in the X-axis direction constitutes one pixel as a display function.

As shown in FIG. 7, the organic EL display panel 110 includes a bank 157 having a lattice shape (so-called pixel bank). The organic EL layer is formed in each of regions partitioned by the bank 157.

Also, the organic EL layer is actually not visible in plan view because at least an anode or a cathode is formed on the organic EL layer as described later. In FIG. 7, the regions partitioned by the bank 157 are represented by hatching.

Returning to FIG. 6, the drive and control unit 120 includes four drive circuits 121-124 and a control circuit 125. Note that arrangement of the organic EL display panel 110 and the drive and control unit 120 in the organic EL display device 101 is not limited to that shown in FIG. 6.

Also, each pixel as the display function is not limited to be constituted from the combination of three subpixels 10a-10c such as shown in FIG. 7. Alternatively, each pixel may be constituted from combination of four or more subpixels.

2. Structure of Organic EL Display Panel 110

Figure 8:
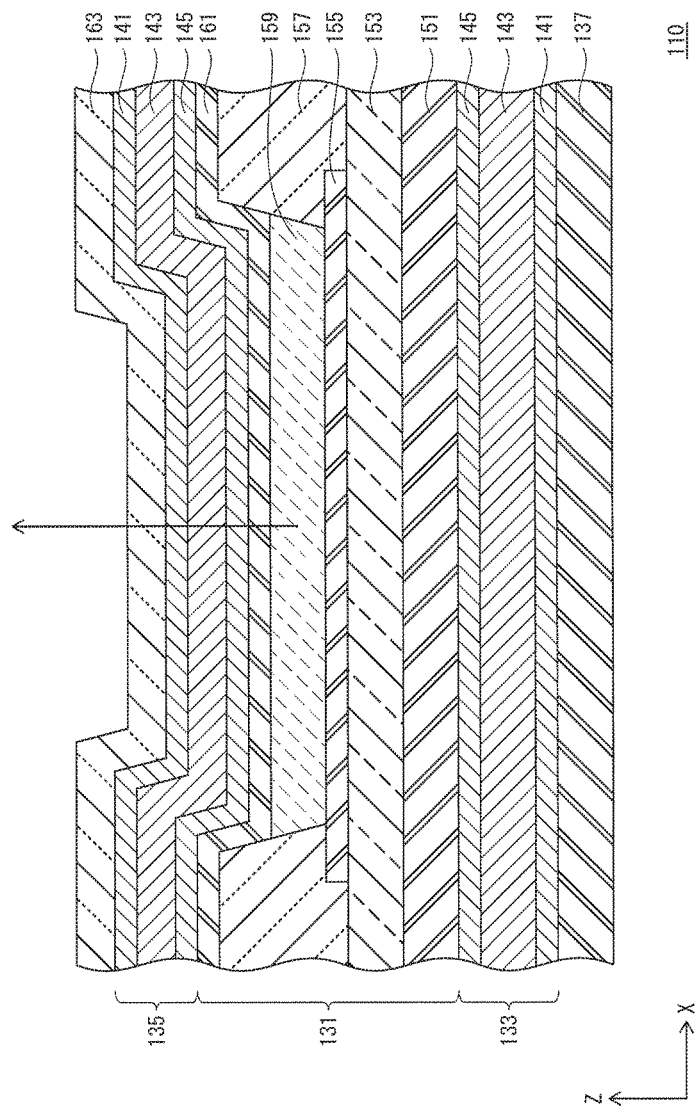
FIG. 8 is a view showing a cross-section taken along a line A-A in FIG. 7 when viewed in an arrow direction.

FIG. 8 is a view showing a cross-section taken along a line A-A in FIG. 7 when viewed in an arrow direction.

As shown in FIG. 8, the organic EL display panel 110 includes a display unit 131, which is sandwiched between a pair of hygroscopic layers 133 and 135, is disposed on a base 137. The subpixels 10a-10c are two-dimensionally arranged in the display unit 131 when viewed in plan. As shown in FIG. 7, the subpixels 10a-10c are formed in subpixel regions that are partitioned to for example a rectangular shape by the bank 157, which has the lattice shape as a whole. The subpixel regions are arranged in matrix in the X-axis direction and the Y-axis direction.

As shown in FIG. 8, the display unit 131 includes an insulating layer 153 that is disposed on a TFT substrate 151. The insulating layer 153 has substantially a planar upper surface in the Z-axis direction. Note that the TFT substrate 151 in the figure is simplified by omitting a TFT layer and so on. An anode 155 is disposed on the subpixel region of the upper surface in the Z-axis direction of the insulating layer 153.

Next, the bank 157 covers an upper surface of the insulating layer 153 and upper surfaces of both ends in the X-axis direction of the anode 155. In the subpixel region partitioned by the bank 157, an organic EL layer 159 is disposed on an upper surface of the anode 155.

A cathode 161 covers an upper surface of the organic EL layer 159 and an upper part of a lateral surface and an upper surface of the bank 157. The hygroscopic layer 135 is disposed on an upper surface of the cathode 161. The hygroscopic layer 135 has a second covering film 145, a hygroscopic film 143, and a first covering film 141.

A surface covering layer 163 is disposed on an upper surface of the hygroscopic layer 135. The surface covering layer 163 has a function of covering and protecting the display unit 131.

The organic EL display panel 110 relating to the present embodiment is of a top emission type, and emits light upward in the Z-axis direction as indicated by an arrow in FIG. 8.

3. Materials of Organic EL Display Panel 110

(1) Base

The base 137 needs to have flexibility. The base 137 is preferably made for example of a resin material as a flexible material, as well as the base 3 in the first embodiment. Here, a polycarbonate film is used as the base 137.

(2) Hygroscopic Layer

The hygroscopic layer 133 has the first covering film 141, the hygroscopic film 143, and the second covering film 145 that are layered one on top of the other, as well as in the first embodiment. In other words, the hygroscopic layer 133 has the structure in which hygroscopic film 143 is sandwiched between a pair of the covering films 141 and 145. Hereinafter, the first covering film 141 and the second covering film 145 are collectively referred to as the first and second covering film 141, 145.

The first and second covering film 141, 145 is made of a material having a low moisture vapor transmission rate, more specifically a moisture vapor transmission rate of $1\times10^{-4}$ g/m²/d to $1\times10^{-6}$ g/m²/d at 40 degrees C. and 90% RH atmosphere. The first and second covering film 141, 145 should preferably have a moisture vapor transmission rate that is as low as possible. Note that the first and second covering film 141, 145 locally includes defects that are inevitable in manufacturing.

The first and second covering film 141, 145 is an inorganic film that is made of an inorganic material. The inorganic film, which is used as the first and second covering film 141, 145, is for example a thin film such as a silicon nitride (SiN) film, a silicon oxide (SiO₂) film, and a silicon oxynitride (SiON) film, a metal film such as an indium tin oxide (ITO) film, or the like. Here, an SiN film is used as the first and second covering film 141, 145.

The hygroscopic film 143 absorbs moisture that has intruded through the defects in the first and second covering film 141, 145. The hygroscopic film 143 is made of a moisture absorbent that is mixed into a base material. Here, the moisture absorbent is aluminum oxide, and the base material is acrylic resin which is an organic material.

(3) Display Unit (3-1) TFT Substrate

The TFT substrate 151 includes a substrate and a TFT layer that is disposed on an upper surface in the Z-axis direction of the substrate. Although not shown in the figure, the TFT layer includes three electrodes, namely a gate electrode, a source electrode, and a drain electrode, a semiconductor layer, a passivation layer, and so on.

The substrate, which is the base of the TFT substrate 151, is a resin substrate or the like. The resin substrate may be made of thermoplastic resin or thermosetting resin. The resin substrate may be made for example of a single layer of any of the following materials or a laminate of any two or more of the following materials including polyolefin such as polyethylene, polypropylene, ethylene-propylene copolymer, and ethylene-vinylacetate copolymer (EVA), cyclic polyolefin, modified polyolefin, polyvinyl chloride, polyvinylidene chloride, polystyrene, polyamide, polyimide (PI), polyamideimide, polycarbonate, poly-(4-methylpentene-1), ionomer, acrylic resin, polymethyl methacrylate, acrylic-styrene copolymer (AS resin), butadiene-styrene copolymer, ethylene vinyl alcohol copolymer (EVOH), polyester such as polyethylene terephthalate (PET), polybutylene terephthalate, polyethylene naphthalate (PEN), and poly cyclohexane terephthalate (PCT), polyether, polyether ketone, polyether sulfone (PES), polyether imide, polyacetal, polyphenylene oxide, modified polyphenylene oxide, polyarylate, aromatic polyester (liquid crystal polymer), polytetrafluoroethylene, polyvinylidene fluoride, other fluororesin, thermoplastic elastomer such as styrenic elastomer, polyolefin elastomer, polyvinyl chloride elastomer, polyurethane elastomer, fluorine rubber elastomer, and chlorinated polyethylene elastomer, epoxy resin, phenol resin, urea resin, melamine resin, unsaturated polyester resin, silicone resin, polyurethane, or copolymer, blend, polymer alloy or the like mainly including such a material.

(3-2) Insulating Layer

The insulating layer 153 is made for example of an organic compound such as polyimide, polyamide, and acrylic resin. Here, the insulating layer 153 should preferably be resistant to organic solution.

Also, the insulating layer 153 sometimes undergoes etching processing, baking processing, and so on in the manufacturing process, and accordingly should preferably be made of a highly resistant material in order to avoid excessive distortion and transformation due to such processing.

(3-3) Anode

The anode 155 is made of a metal material including silver (Ag) or aluminum (Al). The organic EL display panel 110 relating to the present embodiment is of the top emission type, and accordingly should preferably have a surface part that is highly light-reflective.

The anode 155 is not limited to have a single-layer structure of a metal material such as described above, and alternatively may be a laminate of a metal layer and a light-transmissive conductive layer. The light-transmissive conductive layer is made for example of ITO, indium zinc oxide (IZO), or the like.

(3-4) Bank

The bank 157 is made of an insulating organic material such as resin. The organic material of the bank 157 is for example acrylic resin, polyimide resin, novolac-type phenol resin, or the like.

(3-5) Organic EL Layer

The organic EL layer 159 has a function of emitting light by excitation resulting from injection and recombination of holes and electrons. The organic EL layer 159 is made of a luminous organic material by a wet printing method.

Specifically, the organic EL layer 159 should preferably be made for example of a fluorescent substance disclosed in Japanese Patent Application Publication No. H05-163488, such as oxinoid compound, perylene compound, coumarin compound, azacoumarin compound, oxazole compound, oxadiazole compound, perinone compound, pyrrolopyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylenepyran compound, dicyanomethylenethiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, and metal complex of 8-hydroxyquinoline compound, metal complex of 2-bipyridine compound, complex of a Schiff base and group III metal, oxine metal complex, and rare earth complex.

(3-6) Cathode

The cathode 161 is made for example of ITO, IZO, or the like. The organic EL display panel 110 relating to the present embodiment is of the top emission type, and accordingly the cathode 161 needs to be made of a light-transmissive material such as ITO and IZO.

(4) Hygroscopic Layer

The hygroscopic layer 135 may be made of the same material as the hygroscopic layer 133 or a different material from the hygroscopic layer 133. The hygroscopic layer 135 here is made of the same material as the hygroscopic layer 133. The organic EL display panel 110 relating to the present embodiment is of the top emission type, and accordingly the hygroscopic layer 135 needs to be made of a light-transmissive material.

(5) Surface Covering Layer

The surface covering layer 163 covers the display unit 131. The surface covering layer 163 has a function of protecting the display unit 131 from being damaged by shock and so on and a function of preventing the display unit 131 from being directly exposed to moisture and air.

The surface covering layer 163 is made for example of silicon nitride (SiN), silicon oxynitride (SiON), or the like. Alternatively, the surface covering layer 163 may have a multi-layer structure including a layer made of a resin material such as acrylic resin and silicone resin that is layered on a layer made of a material such as SiN and SiON.

The organic EL display panel 110 relating to the present embodiment is of the top emission type, and accordingly the surface covering layer 163 needs to be made of a light-transmissive material.

Third Embodiment

The hygroscopic layer is effective for the function unit in which some kind of functional deterioration is caused by moisture absorption. In the second embodiment, the base 137 is made of a flexible resin film. Alternatively, the base may be made of a glass material which has been conventionally used. In a third embodiment, description is given on an organic EL device (organic EL display device) that includes a glass material as a base and a hygroscopic layer on a top face of the organic EL device.

1. Overall Structure

Figure 9:
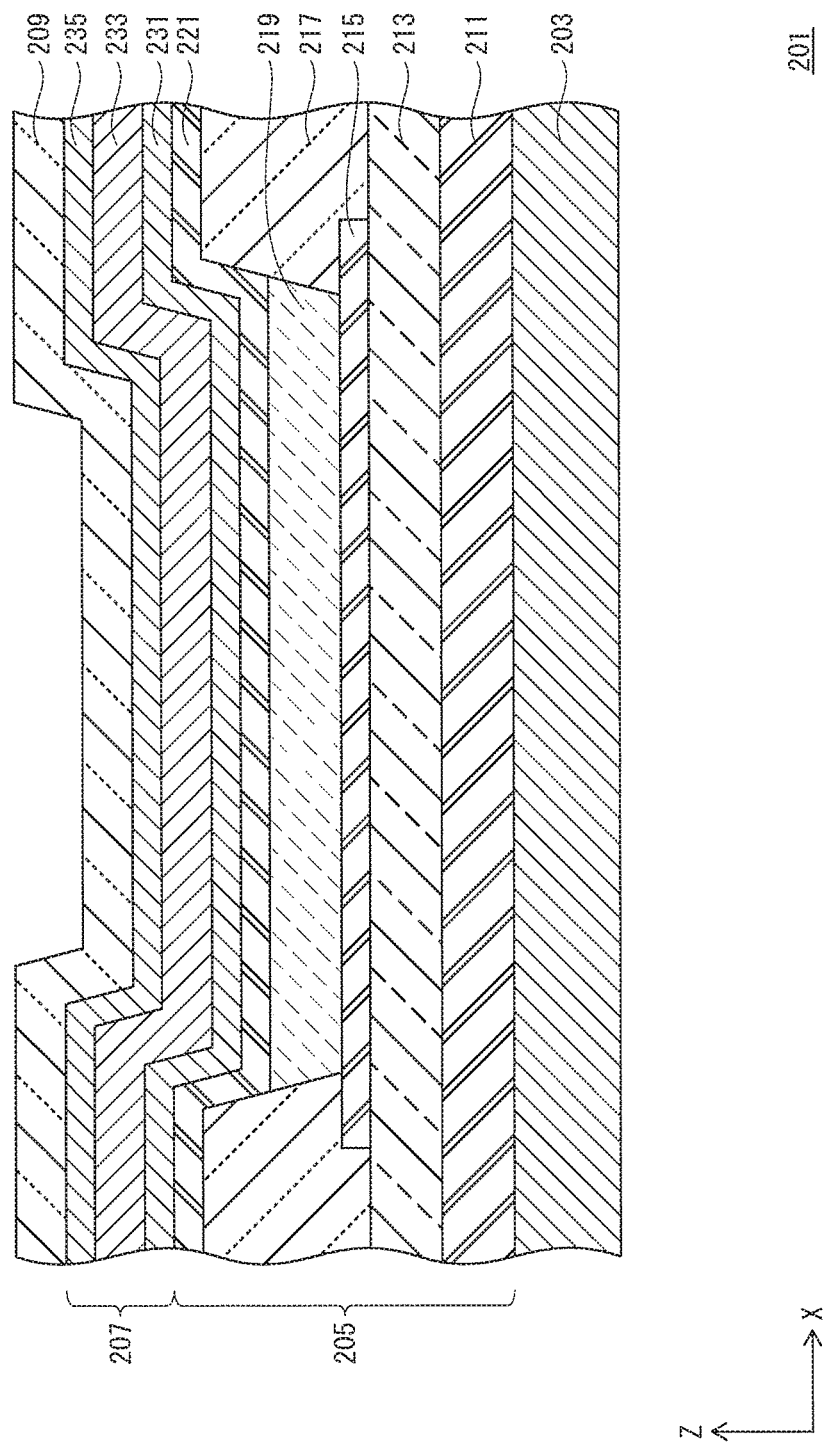
FIG. 9 is a cross-sectional view showing one subpixel of an organic EL display panel.

FIG. 9 is a cross-sectional view showing one subpixel of an organic EL display panel 201.

The organic EL display panel 201 has the structure in which a display unit 205 is disposed on a base 203 and is covered with a hygroscopic layer 207. Subpixels are two-dimensionally arranged in the display unit 205 when viewed in plan, as well as in the second embodiment. The subpixels of R, G, and B colors in the third embodiment have the same basic structure, as well as in the second embodiment. Accordingly, the following description is given without special distinction therebetween in terms of luminescent color.

2. Structure of Units (1) Base

The base 203 cannot be curved, unlike the base 137 in the second embodiment. In other words, the base 203 is made of a material that does not have flexibility at the implementation level. Here, the base 203 is made of a glass material. The glass material has a low moisture vapor transmission rate, unlike the resin material of the base 137 described in the second embodiment. For this reason, no hygroscopic layer needs to be provided between the base 203 and the display unit 205. However, a hygroscopic layer may be provided between the base 203 and the display unit 205. This case exhibits an advantage that the display unit 205 has a further increased operating life, the base 203 has a reduced thickness, and so on.

(2) Display Unit

The display unit 205 includes an insulating layer 213 that is layered on a TFT substrate 211 as a base. An anode 215 is disposed on a subpixel region of an upper surface of the insulating layer 213. A bank 217 covers an upper surface of the insulating layer 213 and upper surfaces of both ends in the X-axis direction of the anode 215. An organic EL layer 219 is formed in the subpixel region which is partitioned by the bank 217.

A cathode 221 covers an upper surface of the organic EL layer 219 and an upper part of a lateral surface and an upper surface of the bank 217.

(3) Hygroscopic Layer

The hygroscopic layer 207 has a first covering film 231, a hygroscopic film 233, and a second covering film 235, as well as in the second embodiment.

Here, the first covering film 231 and the second covering film 235 are each made of an inorganic material such as silicon nitride. The hygroscopic film 233 includes a moisture absorbent that is made of zeolite in particle form and a base material that is made of polycarbonate resin.

Note that the first covering film 231, which is in contact with the display unit 205 (or disposed near the display unit 205) has a larger thickness than the second covering film 235.

(4) Surface Covering Layer

The surface covering layer 209 is made of an inorganic material such as silicon nitride. Note that the second covering film 235 of the hygroscopic layer 207 may be made of an inorganic material. In this case, the second covering film 235 may double as the surface covering layer.

[Modifications]

1. Organic EL Layer

In the second and third embodiments, the hygroscopic layer is provided for the purpose of preventing moisture intrusion into the organic EL layer. However, the present disclosure is not limited to this. The hygroscopic layer may be provided for the purpose of preventing moisture intrusion into the functional layer other than the organic EL layer. That is, in the case where the functional layer has an inherent function that deteriorates due to moisture absorption, it is possible to use the hygroscopic layer to prevent deterioration of the function of the functional layer by preventing moisture intrusion into the functional layer.

Such a functional layer is included for example in an electronic component such as a TFT layer, a thin-film coil, a thin-film transistor, an organic transistor, and a thin-film filter, a function unit of an electronic device such as an electronic paper, a solar battery, and a thin-film lithium ion battery, or the like.

2. Hygroscopic Layer (1) Structure

In the first, second, and third embodiments, only one hygroscopic layer is provided for each of the main surfaces of the display unit. However, the present disclosure is not limited to this. For example, a plurality of hygroscopic layers may be provided for each of the main surfaces of the display unit or the like. This further improves the waterproof property.

Further, in the first, second, and third embodiments, the hygroscopic layer has been described as including the first covering film and the second covering film for one hygroscopic film. Specifically, the hygroscopic layers 5 and 9 in the first embodiment each include the first covering film 23 on one of the main surfaces of the hygroscopic film 23 and the second covering film 25 on the other main surface. The hygroscopic layers 133 and 135 in the second embodiment each include the first covering film 141 on one of the main surfaces of the hygroscopic film 143 and the second covering film 145 on the other main surface. The hygroscopic layer 207 in the third embodiment has the first covering film 231 on one of the main surfaces of the hygroscopic film 233 and the second covering film 235 on the other main surface. However, the present disclosure is not limited to these structures.

The hygroscopic film only needs to have at least one covering film on each of both the main surfaces thereof, and may have a plurality of covering films on each of both the main surfaces thereof. In this case, the number of the covering films on each of both the main surfaces may be the same or different from each other. Further, the covering films may have the same structure or different structures.

Moreover, the hygroscopic layer may have a plurality of hygroscopic films that are layered such as a covering film, a hygroscopic film, a covering film, a hygroscopic film, and a covering film. In this case, the hygroscopic films may have the same structure or different structures.

(2) Hygroscopic Film

The hygroscopic film 23 in the first embodiment, the hygroscopic film 143 in the second embodiment, and the hygroscopic film 233 in third embodiment each include one type of moisture absorbent. However, the hygroscopic film may include a plurality of types of moisture absorbents. Also, in the case where a plurality of hygroscopic films are used, the hygroscopic films each may include the same type of moisture absorbent that is mixed into a different type of base material, or each may include a different type of moisture absorbent that is mixed into the same type of base material.

(3) Moisture Absorbent

The moisture absorbent in each of the first, second, and third embodiments absorbs moisture (moisture vapor). Alternatively, an absorbent which absorbs gas other than moisture vapor such as oxygen may be used. Also in this case, it is possible to set the operating life in consideration of the defects in the covering films by acquiring absorbability of the absorbent with respect to an absorption target by experiments and so on.

3. Device

The organic EL device 1 in the first embodiment, the organic EL display panel 110 of the organic EL display device 101 in the second embodiment, and the organic EL display panel 201 in the third embodiment each include, with respect to the display unit (7, 131, and 205), one or two hygroscopic layers (5 and 9, 133 and 135, and 207). Alternatively, the organic EL device may have the structure in which part of the display unit doubles as one of the covering film of the hygroscopic layer which is disposed near the display unit.

For example, the display unit 131 in the second embodiment includes the cathode 161. In the case where the cathode 161 is for example a metal oxide film such as ITO and IZO which is formed by sputtering, this metal oxide film may be used as the second covering film 145 of the hygroscopic layer which is near the function unit (the display unit 131).

4. Display Unit

The description has been given on the basic structure of the respective display units 131 and 205 in the second and third embodiments. Alternatively, the display unit may for example include a hole injection layer, a hole transport layer, an electron transport layer, an electron injection layer, and so on.

Also, the respective display units 131 and 205 in the second and third embodiments are each of the top emission type. Alternatively, the display unit may be of a bottom emission type. In this case, the base needs to be translucent, the electrode which is near the base (a lower electrode, the respective anodes 155 and 215 in the second and third embodiments) needs to be light-transmissive, and the electrode which is distant from the base (an upper electrode, the respective cathodes 161 and 221 in the second and third embodiments) needs to be light-reflective.

In the second and third embodiments, the anodes 155 and 215 are each disposed as the electrode which is near a corresponding one of the bases 137 and 203. Alternatively, the cathode may be disposed as the electrode which is near the base, for example.

In the second embodiment, the organic EL display device has been described as a color organic EL display device. Alternatively, the structure in the above embodiments and modifications is applicable to for example a monochrome organic EL display device.

Further, the structure in the above embodiments and modifications is applicable to an organic EL light-emitting device having dimming and toning functions. In other words, the organic EL device relating to one aspect of the present disclosure is applicable not only to an organic EL display device mainly having a function as a display but also to an organic EL light-emitting device mainly having a function as a lighting device. In the case where the structure is applicable to such an organic EL light-emitting device, a light-emitting unit is included in the organic EL light-emitting device instead of the display unit having the display function.

INDUSTRIAL APPLICABILITY

The present disclosure is useful for preventing moisture intrusion into an organic EL layer whose function deteriorates due to moisture absorption.

REFERENCE SIGNS LIST 1 organic EL device
5 hygroscopic layer
7 display unit
9 hygroscopic layer
21 first covering film
23 hygroscopic film
25 second covering film

The invention claimed is:

1. An organic EL device comprising:
   an organic EL layer; and
   a hygroscopic layer that is disposed above and/or below the organic EL layer, and has a hygroscopic film, a first covering film, and a second covering film, the first covering film covering one of main surfaces of the hygroscopic film, the second covering film covering the other main surface of the hygroscopic film, wherein
   a relational expression $A/B \geq 0.2$ is satisfied, where A denotes hygroscopicity indicating mass of moisture, expressed in $g/m^2$, that is absorbable by the hygroscopic film per unit of area, and B denotes the number of defects per unit of area, expressed in $pieces/mm^2$, that is calculated based on the number of defects in each of the first covering film and the second covering film.

2. The organic EL device of claim 1, wherein an expression $B \leq 1$ is satisfied.

3. The organic EL device of claim 1, wherein the first covering film and the second covering film are each an inorganic film.

4. The organic EL device of claim 1, wherein the first covering film and the second covering film each have a moisture vapor transmission rate of $1 \times 10^{-4}$ $g/m^2/d$ to $1 \times 10^{-6}$ $g/m^2/d$ at 40 degrees C. and 90% relative humidity atmosphere.

5. The organic EL device of claim 1, wherein the hygroscopic film is made of a resin material containing a moisture absorbent.

6. The organic EL device of claim 5, wherein the moisture absorbent is zeolite.

* * * * *